United States Patent
Thomas

(10) Patent No.: US 12,284,819 B1
(45) Date of Patent: Apr. 22, 2025

(54) ADVANCED LOW ELECTROSTATIC FIELD TRANSISTOR

(71) Applicant: Mammen Thomas, Seattle, WA (US)

(72) Inventor: Mammen Thomas, Seattle, WA (US)

( * ) Notice: Subject to any disclaimer, the term of this patent is extended or adjusted under 35 U.S.C. 154(b) by 0 days.

(21) Appl. No.: 18/907,921

(22) Filed: Oct. 7, 2024

(51) Int. Cl.
*H10D 30/60* (2025.01)
*H10D 64/00* (2025.01)
*H10D 64/66* (2025.01)

(52) U.S. Cl.
CPC ......... *H10D 30/605* (2025.01); *H10D 64/118* (2025.01); *H10D 64/664* (2025.01)

(58) Field of Classification Search
CPC ......................... H10D 30/0275; H10D 30/605
See application file for complete search history.

(56) References Cited

U.S. PATENT DOCUMENTS

| | | | | |
|---|---|---|---|---|
| 6,124,627 A * | 9/2000 | Rodder | ............. | H01L 21/28114 257/E29.135 |
| 6,218,711 B1 * | 4/2001 | Yu | ..................... | H01L 21/02381 257/E21.438 |
| 6,767,798 B2 * | 7/2004 | Kalnitsky | ............ | H10D 10/021 438/363 |
| 9,947,755 B2 * | 4/2018 | Chan | ....................... | H10D 62/85 |
| 11,049,939 B2 * | 6/2021 | Asenov | ................ | H10D 64/259 |
| 2002/0093053 A1 * | 7/2002 | Chan | ................. | H01L 21/76264 257/E21.415 |
| 2010/0252880 A1 * | 10/2010 | Stribley | ............... | H10D 30/027 257/E21.135 |
| 2015/0084064 A1 * | 3/2015 | Yamamoto | ........... | H10D 62/151 257/77 |

\* cited by examiner

*Primary Examiner* — Evren Seven

(57) ABSTRACT

Device scaling has increased the device density of integrated circuits (ICs) and reduced the cost of circuits. Today development of new device structures, use of new materials and complex process steps are implemented to continue scaling of the semiconductor devices. The added manufacturing steps and complexity have increased cost of ICs directly impacting the implementation of IoT devices that need low cost and high yields to be successful. ALEFT-M-LTSEE is a device that reduces cost while improving device performance by S/D resistance reduction. ALEFT-M-LTSEE enable scaling of gate and channel lengths while reducing impact of random threshold variation due to discrete dopants in and around the channel. By creating a flat field profile at the gate by use of low temperature epitaxy as source/drain extension, the short channel effects, and the impact of line edge variations of the gate are reduced.

20 Claims, 4 Drawing Sheets

Cross section of Advanced Low Electrostatic Field Transistor
ALEFT-M-SLTEE

Cross section of Advanced Low
Electrostatic Field Transistor
ALEFT-M-SLTEE

Typical Process Flow (TABLE 1) for ALEFT-M-LTSEE (FIG.1) & NVM- ALEFT-M-LTSEE (Table1)

| | Process step | Mask | Implant |
|---|---|---|---|
| 1. | Start wafer & do shallow trench isolation | 1 | 1 |
| 2. | Standard well implant for P or N | 1 | 1 |
| 3. | Grow sac ox, dep Nitride, | 0 | 0 |
| 4. | Mask P regions clean N/sac Oxide | 1 | 0 |
| 5. | Grow Selective N-epi | 0 | 0 |
| 6. | Grow Oxide on N epi, | 0 | 0 |
| 7. | Mask N regions clean P/ sac Oxide | 1 | 0 |
| 8. | Grow selective P-epi | 0 | 0 |
| 9. | Remove mask and oxide from all epi and clean | 0 | 0 |
| 10. | Deposit Barrier metal interface (typ TiNx) | 0 | 0 |
| 11. | Clean and dep metal(typ W) | 0 | 0 |
| 12.. | Mask and Etch metal (metal& barrier metal on epi) | 1 | 0 |
| 13. | Deposit Thick protection oxide with nitride cover | 0 | 0 |
| 14. | Mask N gate & P gate | 1 | 0 |
| 15. | Etch SiN, SiO2, Metal and time etch epi to hit substrate | 0 | 0 |
| 16. | Gate dielectric (Two thickness) | 1 | 0 |
| *For NVM only tunnel dielectric process* | | | |
| *16A* | *Hard Mask and open NVM area* | *1* | *0* |
| *16B* | *Deposit or grow tunnel dielectric.* | *0* | *0* |
| 17. | Gate sidewall dielectric cover & Etch | 0 | 0 |
| 18. | Gate conductor dep. | 0 | 0 |
| *For NVM only gate conductor dep process* | | | |
| *18A* | *Deposit Floating gate conductor and Coupling Dielectric* | *0* | *0* |
| *18B* | *Mask and etch Coupling Dielectric from non-NVM areas* | *1* | *0* |
| *18C* | *Deposit Control gate conductor* | *0* | *0* |
| 19. | Mask and Etch gate conductor | 1 | 0 |
| *For NVM only gate conductor etch process* | | | |
| *19A* | *Etch control gate conductor* | *0* | *0* |
| *19B* | *Etch coupling Dielectric* | *0* | *0* |
| *19C* | *Etch Floating gate conductor* | *0* | *0* |
| 20. | Gate conductor side wall dielectric spacer dep & etch | 0 | 0 |
| 21. | ILD , Planarize (expose top of gate conductor) | 0 | 0 |
| 22. | Silicide formation on gate top | 0 | 0 |
| 23. | ILD cover deposition & Planarize (polish) | 0 | 0 |
| 24. | Contact Mask &,Etch to Silicide & Metal | 2 | 0 |
| 25. | contact fill | 0 | 0 |
| 26. | 1$^{st}$ Interconnect process (metal) | 0 | 0 |
| | *Total with NVM integration* | *12* | *2* |

*Continue to Process through multiple mentalizations to completion of integration on wafer*

FIG. 2 (Amended)

Cross section of Advanced Low Electrostatic Field Transistor with integrated NVM

NVM-ALEFT-M-SLTEE

*Description of numbering for ALEFT-M-LTSEE of FIG. 1 and NVM- ALEFT-M-LTSEE FIG. 3* (Table2)

| | |
|---|---|
| 100 | - Cross section of *ALEFT-M-LTSEE*. |
| 101 | - Fixed Low dosed well or substrate with low impurity doping. |
| 102 | - Shallow Trench isolation. |
| 103 | - Gate dielectric on the well or substrate surface. |
| 103A | - Cannel region under the gate dielectric. |
| 104 | - Conductive gate Electrode |
| 105 | - Epi Top protection dielectric. |
| 106 | - Selective Low temperature epitaxial Source/ Drain extension. |
| 107 | - Spacer Dielectric. |
| 109 | - Silicide Contact. |
| 110 | - Epi sidewall protection dielectric. |
| 112 | - Metal on Epi extension (typically $TiN_x$/W combination) |
| 120 | - NVM cell integrated on ALEFT-M-LTSEE |
| 121 | - Coupling dielectric between control gate and floating gate. |
| 122 | - Floating gate of NVM. |
| 123 | - Control gate of NVM. |

FIG.4

ADVANCED LOW ELECTROSTATIC FIELD TRANSISTOR

FIELD OF INVENTION

This invention relates to semiconductor device and processing of the same with low or reduced electric fields reducing short channel issues and threshold voltage variability for ensuring high quality and improved characteristics of operation of miniature devices.

BACKGROUND OF THE INVENTION AND THE NEED FOR THE INVENTION

Over the past decade or more scaling of the semiconductor devices has been following Moore's law. But the scaling is bumping against issues of high levels of doping, short channel effects, and threshold variations due to random dopant distribution near and under the gate, that limit the capabilities, quality and operating characteristics of these small devices.

Device scaling has been instrumental in increasing the device density of integrated circuits (ICs) and reducing the cost of these circuits. Today development of new device structures, use of new materials and implementation of complex process steps have to be considered to continue scaling of the semiconductor devices. The number of steps and cost of each step of processing the ICs have also increased with the complexity increase. These process and technology innovations have come with associated cost of circuit implementations, that make the devices very expensive to manufacture and use.

It will hence be optimum if a simpler device structure with simpler processing (with reduced number of steps) that is closer to the original simple process flows in the fab, while having improved short channel effects, low threshold variability and improved operating characteristics is made available to continue the scaling of devices.

The currently filed and pending LEFT-ISD-LTSEE {Low Electrostatic Field Transistor (LEFT) Using implanted S/D and thin (typically having a thickness of the order of 2 to 12 nm) Selective Low Temperature Epitaxial Extension (ISD-LTSEE)} technology (the typical low temperature selective epitaxial growth or deposition is in the temperature range of 300-650 degree centigrade) is one such, that allows scaling of devices without undue stress on lithography to below 20 nm (existing masking capability in the range of 15 to 35 nm) with lower cost of masking and manufacture.

The technology also provides for low temperature processing of the device, especially after the low temperature selective epitaxial growth or deposition (typically the post processing after selective epitaxial growth or deposition is controlled in the temperature range of 300-650 degree centigrade) which reduces or eliminates the diffusion of the dopants within and from the processed doped layers of the transistor.

The current sweet-spot for low cost device manufacture is 28 to 15 nm especially for IoT products that are very sensitive to cost of product which is limited by the manufacturing cost. What is needed today is to find a way to scale the devices without increasing the process complexity and cost unduly. This is what is being proposed in the current application.

THE INVENTIVE IDEA

The ALEFT-ISD-LTSEE {Advanced Low Electrostatic Field Transistor (LEFT) using implanted S/D and Selective Low Temperature Epitaxial Extension (ISD-LTSEE)} allows the gate/channel length of transistors to be scaled below the 20 nm level, even down to 3 nm with appropriate masking and processing, without undue increase in cost of masking and manufacture. The ALEFT-ISD-LTSEE technology builds on the previously patent applied for LEFT-ISD-LTSEE technology by enabling one mask, the gate mask to be used on a planar surface to enable channel length to be scaled without major impact on the rest of the process.

Two problem of the patnet pending ALEFT-ISD-LTSEE technology is the increase in the source/drain (S/D) resistance of the device and the need for shallow S/D implant requirement. High Source/Drain resistance degrades the operating characteristics of the devices. The current idea is to reduce the S/D resistance of the devices by using a conductive metal layer over the selective low temperature epitaxial S/D extension (ALEFT-M-LTSEE).

The surface doping concentration of the selective epitaxial layer has to be made so that such that the metal contact to the semiconductor is a conductive contact and not a Schottky contact. For this an initial $TiN_x$ barrier metal is used over the selective epitaxial silicon extension before the metal preferably W conductor deposition. The low temperature selective epitaxial extension is optimally grown with a graded dopant concentration, with a reasonably high surface layer concentration to reduce S/D resistance and prevent formation of Schottky contact at the metal interface.

As with the ALEFT-ISD-LTSEE integrating NVM with the ALEFT-M-LTSEE device to provide a NVM-ALEFT-M-LTSEE is simple. This is done by splitting the conductive gate (104) in two sections, a floating gate (122) and a control gate (123) by adding just a coupling dielectric (121) that separates the floating gate from the control gate.

DESCRIPTION OF FIGURES

FIG. 2—is an exemplary Table 1-showing a typical process flow of major steps for implementing the first embodiment of the inventions shown in FIG. 1 and FIG. 3.

FIG. 4—is an exemplary Table 2-showing the Description of numbering for ALEFT-M-LTSEE of FIG. 1 and NVM-ALEFT-M-LTSEE FIG. 3

Figure 1:
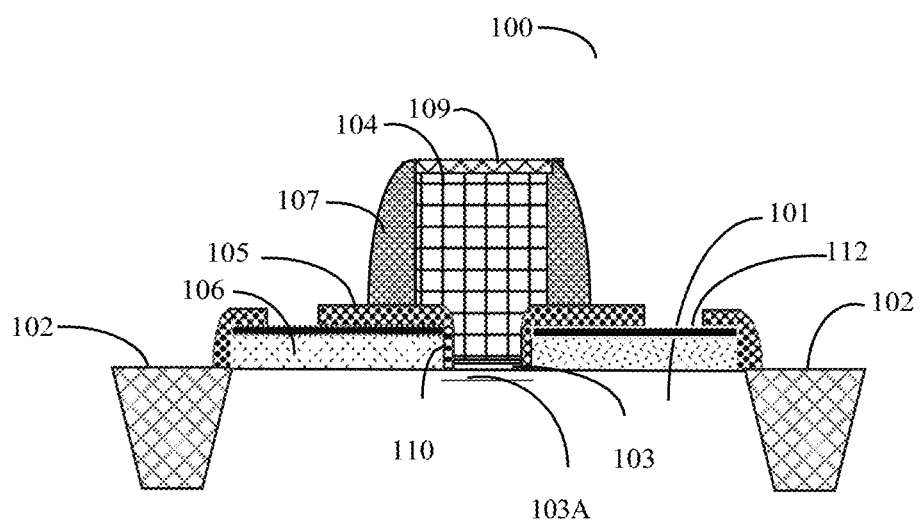
FIG. 1—is an exemplary and non-limiting cross sectional view of the current invention showing the set of structural elements of the ALEFT-M-LTSEE {Advanced Low Electrostatic Field Transistor (LEFT) Using metallization over Selective Low Temperature Epitaxial Extension (M-LTSEE)} Transistor/Device per the invention.
Figure 3:
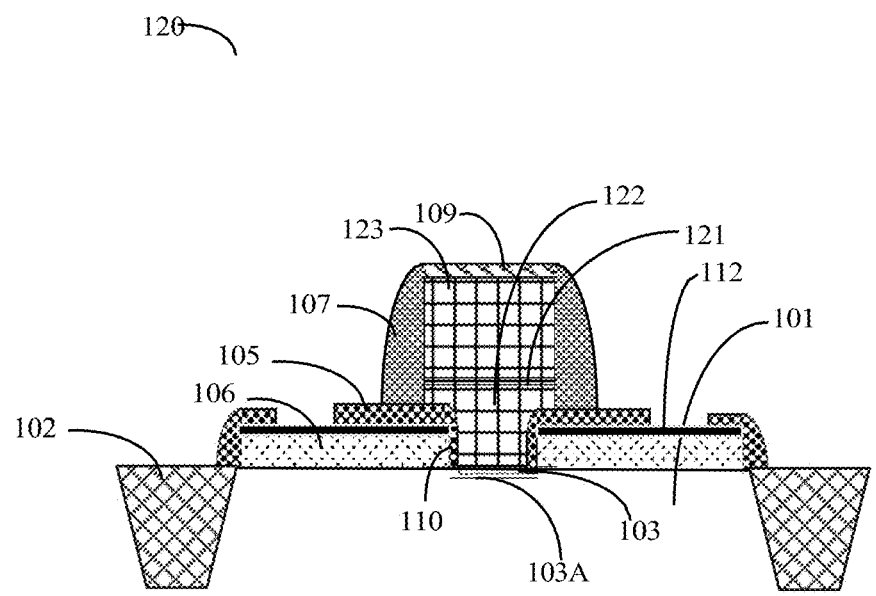
FIG. 3—is an exemplary and non-limiting cross sectional view of an embodiment of the current invention showing the set of structural elements of the NVM-ALEFT-M-LTSEE {Non-Volatile memory integrated with the {Advanced Low Electrostatic Field Transistor (LEFT) Using metallization over Selective Low Temperature Epitaxial Extension (M-LTSEE)}

DETAILED DESCRIPTION OF THE ALEFT-M-LTSEE {ADVANCED LOW ELECTROSTATIC FIELD TRANSISTOR (ALEFT) USING METALLIZATION OVER SELECTIVE LOW TEMPERATURE EPITAXIAL EXTENSION (M-LTSEE)}

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have resulted in increased cost of ICs directly impacting the implementation of IoT devices that need low cost and high yields to be successful.

ALEFT-M-LTSEE is a device that reduces the cost while improving device performance. ALEFT-M-LTSEE is suitable for sub 20 nm sizes (typically 3-35 nm gate lengths) where random threshold variation due to impact of discrete dopants in and around the channel becomes a critical consideration. By using ALEFT-M-LTSEE the random threshold variation due to impact of discrete dopants in and around the channel is reduced by elimination of a number of implants and thermal drives. Also, by having a flat field profile at and around the gate, by use of low temperature epitaxy as source/drain extension, the short channel effects, and the impact of line edge variations of the gate are also reduced. The problem of high source drain resistance due to use of epitaxial extensions is solved in the current implementation by adding a metal layer over the selective epitaxial extensions, typically a barrier layer of Titanium Nitride layer ($TiN_x$) and W combination that reduces the resistance of Source and Drain of the completed devices. Also during the epitaxial process it is necessary to increase the surface doping of the selective Epi to avoid formation of any Schottky junction at the metal to silicon interface.

The currently disclosed ALEFT-M-LTSEE structure builds on the technology and processes used for patent pending ALEFT-ISD-LTSEE transistor to achieve smaller gate lengths with associated channel sizes (gate/channel shrinkage) and low S/D series resistance. Since the process and technology of ALEFT-M-LTSEE are built on the patent pending ALEFT-ISD-LTSEE process and technology by eliminating the implants, it is able to bring with it all the advantages of the ALEFT-ISD-LTSEE device. Further the reduction of source and drain resistance by use of metallization on the selective epitaxial extensions improve the operating characteristics of the device.

A simplified device technology that can be implemented with a reduced number of masking and process steps is proposed for the ALEFT-M-LTSEE based on the prior disclosed ALEFT-ISD-LTSEE. The device structure reduces the effect of threshold variance and short channel effects on the operation of the devices developed and allow the devices to be scaled with minimum increase in device complexity. By adding the metallization over the selective low temperature epitaxial extensions, the technology allows for low source(S) and drain (D) resistance for the developed device. The processing is made much simpler by reduction or elimination of implant steps and associated high temperature activation/drives but uses available process steps with lower temperature processing and low temperature selective graded epitaxial depositions (where doping is changed during deposition) and metallization processes. The replacement/elimination of critical implant around the gate of the device and the associated activation steps reduce uncertainty of dopant location relative to the channel and help reduce the associated variability of device characteristics. The reduction in short channel effects and reduction in variability of device characteristics enable the devices to move down the device scaling and integration path. The disclosed device and technology are usable for device processing on planar semiconductor wafers, on Silicon on Insulator (SOI) and other novel device structures at and below the 20 nm (range in the 35 to 3 nm) device dimensions.

FIG. 1 shows an exemplary cross section of the ALEFT-M-LTSEE transistor and the structural details. The shown structure uses the low temperature selective graded epitaxial source and drain extensions (106) that have graded in situ doping with low doping at the substrate surface and higher doping at the top surface layers to initially reduce the S/D resistance and eliminate Schottky contact formation with metal, {the possible dopant range being $1e^{16}$ to $5e^{21}$ atoms per $cm^3$} and a metallization (112) comprising preferably a barrier layer of Titanium Nitride ($TiN_x$) on the top surface of the selective epitaxial extension with typically a tungsten (W) or other suitable low resistance metal layer to further improve the S/D resistance. {Does not prevent use of the $TiN_x$ layer alone as the metal conductor (112).} These low temperature selective epitaxial source drain extensions (106) are enabled for variations in selective epitaxial thickness adjustment and insitu doping as required to adjust the epi surface doping and improve the S/D resistance of the finished ALEFT-M-SEE (100) transistor device. By eliminating the implants from the vicinity of the channel, the influence of the vertical field at the channel edge, influencing/controlling the channel is reduced. Typically, due to the flat nature of the fields around the gate the electrostatic fields perpendicular to the plane of the gate dielectric to substrate interface are less than $5 \times 10^5$ volts/cm over more than 50% of the channel area under all operating conditions.

In the preferred and typical embodiment the ALEFT-M-LTSEE transistor (100) gate/channel region (103A) is defined by masking the graded selective low temperature epitaxial extensions (106) after the metal (112) deposition and the deposition of a thick dielectric protective cover (105) on the metallization. {Alternately using a more complex overall process, the gate region prior to the selective epitaxial growth is masked on the flat wafer surface with a thin oxide/Nitride/oxide cover to leave the original Nitride/Oxide layer intact in the gate region, The selective epitaxial growth (106) does not happen in the gate region due to the OX/N/OX coverage on substrate}. The graded selective epitaxial extension is then covered by a dielectric (105) such that the epitaxial extensions have a thicker protective dielectric layer (105) on the surface that is thicker than the gate oxide (103) to be grown in the gate region. This dielectric deposition will also deposit a dielectric protective layer (110) on the side wall of the selective epitaxial extension (106) preventing the gate electrode (104) from contacting the source/drain (S/D) extension (106).} In the preferred process the epitaxial silicon extension can be grown on all the device regions and covered with a thick dielectric before the gate mask and etch is done. In this case the gate is masked on a flat dielectric surface that allow simple masking to be done. The etch then has to have multiple etch chemistries to etch the protective dielectric (105) over the metallization, the metallization (112) and then a timed silicon etch to remove the low temperature epitaxial extension as the bottom silicon substrate (101) is also silicon. A sidewall protection dielectric (110) has then to be deposited to protect the sidewalls of the low temperature epitaxial extension form the gate electrode (104). The exposed gate/channel region (103A) is covered by a gate dielectric (103) grown or deposited. The conductive gate electrode (104) is now deposited over the gate dielectric (103) with the selective epitaxial extension (106) protected from the gate electrode by the by the protective dielectric layers (110 and 105). The gate structure is etched leaving an overlap on the protective dielectric layer (105) as shown in FIG. 1. The side walls of the etched gate structure is covered by a dielectric protective layer (107) typically using a deposition and if needed a LDD etch, to complete the exemplary gate structure comprising the conductive gate electrode (104) over the gate dielectric (103) with protected side walls, protected the by dielectric (110), the gate conductor (104) extension over the S/D epitaxial extension (106) on top by the thick protection dielectric (105) and the etched gate side walls by the dielectric (107). The gate process defined enable the gate (103) definition to be done on the flat dielectric (105) over the metallized (112) epitaxial extensions (106) on the substrate surface and the gate to be defined by the low temperature selective epitaxial growth of the source and drain extensions (106) remaining on either side of the gate.

FIG. 2—shows a Table 1 associated with an exemplary embodiment shown in FIG. 1, provides an exemplary process flow for manufacture of the ALEFT-ISD-LTSEE transistor of embodiment 1.

The FIG. 2—showing the typical process flow of Table 1 also provides an idea of the reduction in complexity of the process for ALEFT-M-LTSEE transistor to identify the number of steps, implants and thermal diffusions eliminated in the current process.

The structure and process allow either silicon gate or metal gate technology to be implemented. As an exemplary process, the silicon gate process is described. If the silicon gate is considered as a sacrificial gate, the technology can be adapted for metal gate. Further the technology is also implementable on SOI wafers with equal ease.

FIG. 1 shows the completed exemplary structures of the advanced low electrostatic field device (ALEFT) using Metallization over the thin low temperature selective Epitaxial Extension (M-LTSEE), the ALEFT-M-LTSEE (100) transistor device as per the preferred embodiment of the invention. The exemplary details of manufacture of the embodiment is provided by the processing description in the table 1 as previously indicated. The ALEFD-M-LTSEE (100) transistor is shown in FIG. 1 on a silicon substrate or a well (101) formed in the silicon substrate, both having a low dopant concentration. A shallow trench isolation 102 is used to define device and isolate the device from neighboring structures. The low dosed well/substrate (101) typically having a fixed dopant concentration in the range of $10^{15}$ to $1 \times 10^{17}$ atoms per $cm^{-3}$ forms the active region of the ALEFD-M-LTSEE (100). A gate structure comprising a gate oxide (103) on semiconductor well/substrate (101) surface, with a conductive gate material (104) preferably amorphous silicon or other suitable conductive material, having sidewall insulation dielectric (110) is used to control a channel region (103A) under the gate oxide (103). A selective epitaxial layer grown on the surface of the substate using low temperature epitaxial process establishes the Source extension (106) and Drain extensions (106) of the ALEFT using Metallization (M) (112) over the ALEFT-M-LTSEE (100) transistor. The Selective epitaxial layers (106) with higher doping concentration on the top layers provides the Source and Drain regions of the device including the S/D extensions for the device made. The gate contact area is silicided (109) to establish good low resistance contact to the gate conductor. The source and drain contacts are made by vias etched to the metallization (112) over the selective epitaxial source extension (106), and the epitaxial drain extension (106).

The Source and drain extensions 106 are used to connect to the source and drain regions to the channel region 103A under the gate oxide 103 that is controlled by the voltage applied to the conductive gate electrode (104).

The gate dielectric (103) on the semiconductor substrate surface/well (101) surface, the low temperature epitaxial source and drain extensions (106) in contact with the substrate/well are all coplanar on the semiconductor substrate surface.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to Table 1.

FIG. 2 showing Table 1 provides a typical set of the major steps required to implement P and N channel ALEFT-M-LTSEE (100) transistor devices, of the first embodiment, shown in FIG. 1, on a silicon wafer. The common main steps are grouped together in the table and a number of implants and masking steps required are provided. The list clearly shows the substantial reduction in critical process steps that are possible with the disclosed device implementation.

The post low temperature selective epitaxial extensions and the low temperature post processing provides almost no dopant movement from the thin selective epitaxial layer into the silicon substrate, via the contact interface from the low temperature selective source/drain (S/D) epitaxial extensions to the silicon substrate and the channel of the ALEFT-M-LTSEE (100) transistor device.

In addition, by providing a S/D extension which is on silicon surface almost in the plain of the channel enable the eliminate the short channel issues and the requirement for complex drain engineering.

By providing non implanted Source/Drain extensions using low temperature selective Epitaxial process and a uniformly doped well, the random variation of the threshold of the device due to random placement of dopant ions in or near the channel, namely the sigma Vt of the device is reduced substantially providing the device the capability to use lower supply voltages and scale to much smaller dimensions with very limited additional effort.

One of the major items to be noted in comparing the characteristics of prior art devices on planar silicon surface with the characteristics of the ALEFT-M-LTSEE (100) transistor characteristics is that the ALEFT-M-LTSEE (100) transistor channels are approximately same as the masked gate length less the side wall protection dielectric where as the prior art devices have channel lengths defined by the extension of implanted dopant typically LDD under the gate of the devices. So comparisons have to be done based on the channel lengths rather than the masked gate lengths.

Implementation of ALEFT M-LTSEE (100) Transistor on SOI Substrate.

Even though the implementation described is on planar silicon wafers, the process and technology are adaptable to manufacture on SOI wafers with minimum changes well understood by the process engineers. Using the SOI wafer enables the devices to be implemented to accept back bias for further control of Vt values.

Drain Engineering for Short Channel Effects and Strain.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Some Advantages of the Current Disclosed Inventions Described Include:

The ALEFT-M-LTSEE (100) transistor provides the advantages indicated below.

16. Very low electrostatic field at source and drain junctions, allowing very small planar devices to be implemented and scaling to be continued.

17. Reduced variation of threshold (sigma Vt) over the designed value due to impact of discrete dopants in and around the channel.

18. Elimination of complex Drain engineering to achieve low fields impacting the gate.

19. Reducing the number of implants drastically, thereby reducing the total steps for device implementation.

20. Use of a sacrificial spacer (similar to spacer last) technology in one implementation with selective epitaxial growth for gate length control and low series resistance.

21. Use of low temperature processing to limit diffusion of dopants and associated gate length variations.

22. Very low diffusion from Epi to ensure S/D to channel connectivity under all conditions.

23. Elimination of implants and high temperature steps for establishing critical dimensions and device characteristics reduce the process related variations of threshold (sigma Vt) due to random dopant near and in the channel.

24. Reduced number of critical masking steps.

25. Overall reduction in complexity of process with associated cost reduction.

26. Implementable on planar silicon, and SOI substrates.

27. Can be implemented using silicon or metal gate technologies.

28. Strain engineering may be implemented in the usual manner if so desired with the technology.

29. Ability to scale the gate size to much smaller dimensions by using masking of the gate on flat surface and defining the gate by the low temperature selective epitaxial growth.

30. The us of thicker protection dielectric (to protect the low temperature selective epitaxial Source and drain extensions enable reduction in the gate to S/D coupling improving device performance.

Though the process and the implementation examples have been provided for both single crystal silicon substrate and SOI substrate the technology shown should not be construed to be limited by the examples provided. The technology with additional changes is implementable into almost any semiconductor process, including high voltage processes, FinFET process etc. with appropriate changes to improve the short channel effects and speed of the devices as will be well understood by practitioners of the art. These implementations though not shown in the application are being covered by the application.

Though a silicon based process is described in the current application, it should also be not considered limiting. The technology described may be implemented effectively to reduce process complexity and improve characteristic of other semiconductor devices, with changes in process as will be well understood by practitioners of the art. Other typical semiconductors include but are not limited to 3-5 compounds, Silicon Carbide etc. where the patent can be effectively applied.

What is claimed is:

1. A transistor structure comprising:
   a substrate having a top planar surface;
   a monolithic epitaxial source region formed entirely over the top planar surface;
   a monolithic epitaxial drain region formed entirely over the top planar surface and separated from the source region by a gap, wherein inner sidewalls of the source and drain regions define the gap;
   an isolation layer having a first portion formed on top surfaces and a second portion formed on inner sidewalls on the source and drain regions;
   a gate dielectric formed in the gap and contacting the substrate; and
   a gate electrode comprising:
      a first region having a first width formed in the gap between the second portion of the isolation structure and contacting the gate dielectric; and
      a second region having a second width greater than the first width, wherein the second region overlaps the first portion of the isolation layer.

2. The transistor structure of claim 1, wherein the substrate is lightly doped.

3. The transistor structure of claim 1, wherein the second region of the gate electrode comprises a separation dielectric layer.

4. The transistor structure of claim 3, wherein the separation dielectric layer defines a floating portion of the gate electrode and a control portion of the gate electrode.

5. The transistor structure of claim 1, further comprising sidewall spacers formed on sidewalls of the second region of the gate electrode.

6. The transistor structure of claim 1, further comprising a silicide layer formed on a top surface of the second region of the gate electrode.

7. The transistor structure of claim 1, further comprising a metallization layer between top surfaces of the source and drain regions and the isolation layer.

8. The transistor structure of claim 7, wherein the isolation layer comprises an opening exposing the metallization layer.

9. The transistor structure of claim 1, wherein the epitaxial source and drain regions have a graded dopant concentration having a highest concentration at the top surface and a lowest concentration at a bottom surface.

10. A method for forming a transistor structure, comprising:
    providing a substrate having a top planar surface;
    forming a monolithic epitaxial source region formed entirely over the top planar surface;
    forming a monolithic epitaxial drain region formed entirely over the top planar surface and separated from the source region by a gap, wherein inner sidewalls of the source and drain regions define the gap;
    forming an isolation layer having a first portion formed on top surfaces and a second portion formed on inner sidewalls on the source and drain regions;
    forming a gate dielectric formed in the gap and contacting the substrate; and
    forming a gate electrode comprising:
       a first region having a first width formed in the gap between the second portion of the isolation structure and contacting the gate dielectric;

a second region having a second width greater than the first width, wherein the second region overlaps the first portion of the isolation layer.

11. The method for forming a transistor structure of claim 10, wherein forming the monolithic epitaxial source and drain regions comprises:
   forming a mask over the top planar surface, the mask having openings defining a growth area for the epitaxial source and drain;
   growing the source and drain regions by selective low temperature epitaxy, such that the source and drain regions are self-aligned in the openings.

12. The method for forming a transistor structure of claim 11, wherein the low temperature epitaxy is a graded epitaxial process resulting in a graded dopant concentration in the source and drain regions.

13. The method for forming a transistor structure of claim 11, wherein the graded epitaxial process results in the dopant concentration being highest at the top surface and lowest at a bottom surface.

14. The method for forming a transistor structure of claim 11, wherein the low temperature epitaxy is performed below 650 C.

15. The method for forming a transistor structure of claim 10, further comprising forming a metallization layer between the top surface of the source and drain regions and the isolation layer.

16. The method for forming a transistor structure of claim 10, further comprising forming a separation dielectric in the second region of the gate electrode defining a floating portion of the gate electrode and a control portion of the gate electrode.

17. The method for forming a transistor structure of claim 10, further comprising forming a silicide layer on a top surface of the second region of the gate electrode.

18. The method for forming a transistor structure of claim 10, further comprising forming sidewall spacers over side surfaces of the second region of the gate electrode and over a first portion of the isolation layer.

19. A non-volatile memory cell comprising the transistor structure of claim 1.

20. A method of forming a non-volatile memory cell comprising the method of claim 10.

* * * * *